(12) United States Patent
Kukreja et al.

(10) Patent No.: US 8,701,076 B2
(45) Date of Patent: Apr. 15, 2014

(54) CAPTURE OF INTERCONNECTIVITY DATA FOR MULTI-PIN DEVICES IN THE DESIGN OF EMULATOR CIRCUIT BOARDS

(75) Inventors: Anil Kukreja, San Diego, CA (US); Mike Zimmerman, Cary, NC (US); Vivek Khushoo, San Diego, CA (US); Sampath Kothandaraman, San Diego, CA (US); Longjun Li, San Diego, CA (US); Vinh Nguyen, Mira Loma, CA (US); Mahmoud Azartash, San Marcos, CA (US); Duong Tran, Poway, CA (US); Sumeet Suri, Kirkland, WA (US)

(73) Assignee: QUALCOMM Incorporated, San Diego, CA (US)

( * ) Notice: Subject to any disclaimer, the term of this patent is extended or adjusted under 35 U.S.C. 154(b) by 505 days.

(21) Appl. No.: 12/692,110

(22) Filed: Jan. 22, 2010

(65) Prior Publication Data

US 2010/0211373 A1    Aug. 19, 2010

Related U.S. Application Data

(60) Provisional application No. 61/146,415, filed on Jan. 22, 2009.

(51) Int. Cl.
*G06F 17/50* (2006.01)
(52) U.S. Cl.
USPC ............................. 716/137; 716/106; 716/136

(58) Field of Classification Search
USPC .................................. 716/100–106, 136–137
See application file for complete search history.

(56) References Cited

U.S. PATENT DOCUMENTS

| 6,564,367 | B1 * | 5/2003 | Fujii et al. ...................... 716/117 |
| 2002/0128812 | A1 * | 9/2002 | Gooding et al. ................. 703/23 |
| 2003/0182641 | A1 * | 9/2003 | Yang .................... 716/4 |
| 2004/0078179 | A1 * | 4/2004 | Fuji et al. ......................... 703/15 |
| 2004/0254906 | A1 * | 12/2004 | Shei et al. ...................... 706/921 |

OTHER PUBLICATIONS

International Search Report and Written Opinion—PCT/US2010/021845—ISA/EPO—Apr. 21, 2010.

* cited by examiner

*Primary Examiner* — Paul Dinh
(74) *Attorney, Agent, or Firm* — Nicholas J. Pauley; Peter Michael Kamarchik; Joseph Agusta

(57) ABSTRACT

Capturing interconnectivity data for one or more multi-pin devices in the design of emulator circuit boards is automated using a translator that extracts relevant information, from a text-based input/output (I/O) definition file. The I/O definition file contains textual descriptions of I/O connectivity information for the various devices created by partitioning the design for application on the emulator circuit board, undefined connector interface entries, and design-specific information. The translator parses through the I/O definition file extracting the I/O connectivity and design-specific information, and retrieves connector interface definitions for the undefined connector interface entries using vendor data.

18 Claims, 8 Drawing Sheets

CAPTURE OF INTERCONNECTIVITY DATA FOR MULTI-PIN DEVICES IN THE DESIGN OF EMULATOR CIRCUIT BOARDS

RELATED APPLICATIONS

This application claims priority to U.S. Provisional Patent Application No. 61/146,415 filed Jan. 22, 2009, entitled CAPTURE OF THE INTERCONNECTIVITY BETWEEN MULTI-PIN DEVICES DURING AN EMULATOR DESIGN PROCESS, the disclosure of which is expressly incorporated by reference herein in its entirety.

TECHNICAL FIELD

The present disclosure generally relates to emulator circuit board design, and, more particularly, to capture interconnectivity data for one or more multi-pin devices in the design of emulator circuit boards.

BACKGROUND

Part of the process in designing and developing an integrated circuit ("IC" or "chip") is to verify the functionality of the chip prior to fabrication. It takes a significant amount of time for a design to be verified and finalized. Emulator circuit boards are used to model the design of the chip prior to actual fabrication. Such emulator circuit boards can use multi-pin devices, such as multiple field programmable gate arrays (FPGAs), complex programmable logic devices (CPLDs), and the like, to implement and simulate the gate logic of the chip design.

To verify a particular chip design, it is often mapped over to emulator boards. These boards traditionally provide for one or more multi-pin devices like FPGAs or CPLDs. One of these multi-pin devices may not be large enough on its own to model the entire chip design. Therefore, the high-level chip design may be partitioned into many smaller modules that are mapped into multiple multi-pin devices. The design complexity of the chip and the large number of pins on the multi-pin devices pose a challenge in designing the emulator boards. Test engineers not only account for the translation of the single chip design to one or more multi-pin devices, they also account for all of the interconnections between each of the pins of the group of multi-pin devices and other devices/connectors on the emulator boards by defining the input/output (I/O) configuration for each device and defining how each device connects to the rest of the system. Because the operation of these emulator boards depends on the accuracy of the design translation onto the boards, the mapping process is extremely important, challenging, and time consuming.

These interconnections are defined and modeled manually. The design engineers define the various interconnections in a spreadsheet, which is then used by a post processing tool in the course of designing the emulator boards. This design and mapping process is difficult and time consuming.

BRIEF SUMMARY

The present teachings are directed to capturing of interconnectivity data for multi-pin devices in the design of emulator circuit boards. The capturing is provided by a translator that extracts the relevant information from a text-based input/output (I/O) definition file. The I/O definition file contains textual descriptions of I/O connectivity information for the various multi-pin devices that are created by partitioning the IC design for application on the emulator circuit boards. It also includes undefined connector interface entries and design-specific information, such as rail voltage, voltage type, signal polarity, signal width, and the like. The translator parses through the I/O definition file extracting the I/O connectivity and design-specific information, and retrieves connector interface definitions for the undefined connector interface entries using a vendor data. The resulting extracted information is then available for post processing in the design procedure for emulator circuit boards.

Additional representative embodiments of the present teachings are directed to methods for capturing interconnectivity data for multi-pin devices in the design of emulator circuit boards. These methods include parsing an input/output (I/O) definition file representing an integrated circuit (IC) design, where the I/O definition file defines at least one device created by partitioning the IC design for application through at least one multi-pin device on an emulator circuit board. The methods also include extracting I/O connectivity information for each device or devices from the I/O definition file, generating connector interface definitions for each undefined connector interface identified in the I/O definition file, and extracting design-specific information related to the IC design from the I/O definition file.

Further representative embodiments of the present teachings are directed to emulator circuit board design systems. The systems include a processor, an input/output (I/O) interface coupled to the processor, a display device coupled to the I/O interface, an input device coupled to the I/O interface, a communication interface coupled to the processor, a storage memory coupled to the processor, and a translator stored on the storage memory. When executed by the processor, the translator configures the system to parse an I/O definition file representing an IC design, wherein the I/O definition file defines one or more devices created by partitioning the IC design for application on an emulator circuit board. It also configures the system to extract I/O connectivity information for one or more devices from the I/O definition file, to generate connector interface definitions for each undefined connector interface identified in the I/O definition file, and to extract design-specific information related to the IC design from the I/O definition file.

Still further representative embodiments of the present teachings are directed to computer-readable media including program code tangibly stored thereon. The program code includes code to parse an input/output (I/O) definition file representing an integrated circuit (IC) design, where the I/O definition file textually defines at least one or more devices that are created by partitioning the IC design for application on an emulator circuit board. It also includes code to extract I/O connectivity information for one or more devices from the I/O definition file, code to generate connector interface definitions for each undefined connector interface identified in the I/O definition file, and code to extract design-specific information related to the IC design from the I/O definition file.

Further representative embodiments of the present teachings are directed to systems for capturing of interconnectivity data for one or more multi-pin devices in the design of emulator circuit boards. These systems include means for parsing an input/output (I/O) definition file representing an integrated circuit (IC) design, where the I/O definition file textually defines at least one or more devices that are created by partitioning the IC design for application on an emulator circuit board. The systems also include means for extracting I/O connectivity information for one or more devices from the I/O definition file, means for generating connector interface definitions for each undefined connector interface identified in the I/O definition file, and means for extracting design-specific information related to the IC design from the I/O definition file.

Further representative embodiments of the present teachings are directed to methods for capturing interconnectivity data for one or more multi-pin devices in the design of emulator circuit boards. These methods include the steps for analyzing an input/output (I/O) definition file representing an integrated circuit (IC) design, where the I/O definition file textually defines at least one or more devices that are created by partitioning the IC design for application on an emulator circuit board. The methods also include extracting I/O connectivity information, undefined connector interface notations, and design-specific information contained in the I/O definition file.

The foregoing has outlined rather broadly the features and technical advantages of the present disclosure in order that the detailed description that follows may be better understood. Additional features and advantages can be described hereinafter, which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features, which are believed to be characteristic of the disclosure, both as to its organization and method of operation, together with further objects and advantages, can be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Emulator circuit boards which contain one or more multi pin programmable logic devices allow for verification of an integrated circuit ("IC" or "chip") design by partitioning the IC design into multiple modular segments. A single IC design, such as a design for an application-specific IC (ASIC), may call for multi-millions of gates. In general, a programmable logic multi-pin device such as an FPGA, emulator board will have up to approximately a million available programmable gates. Therefore, in order to model such an ASIC onto an emulator circuit board, the ASIC design would be partitioned into separate programmable logic multi-pin devices. The IC is partitioned in such a way that, different portions of the IC will fit on one or more of these multi-pin devices. For example, a particular ASIC design for a high density processor may have ten million gates. However, each programmable logic multi-pin device of the emulator circuit board being used may be limited to one million effective programmable gate cells. The partitioning process, therefore, would divide the ASIC design into multiple, interconnected modules, where each module would not require more than one million programmable gate cells. Each of the separate parts of the IC may also be divided logically into multiple functional blocks. A post processing tool then maps each partitioned block of the IC into a different programmable logic multi-pin device on the emulator circuit board by programming the gates of that multi-pin device for the functionality of the partitioned IC block. The connections between the different partitioned functional blocks are also programmed by the post processing tool in order to complete the connectivity of the ASIC design.

Figure 1:
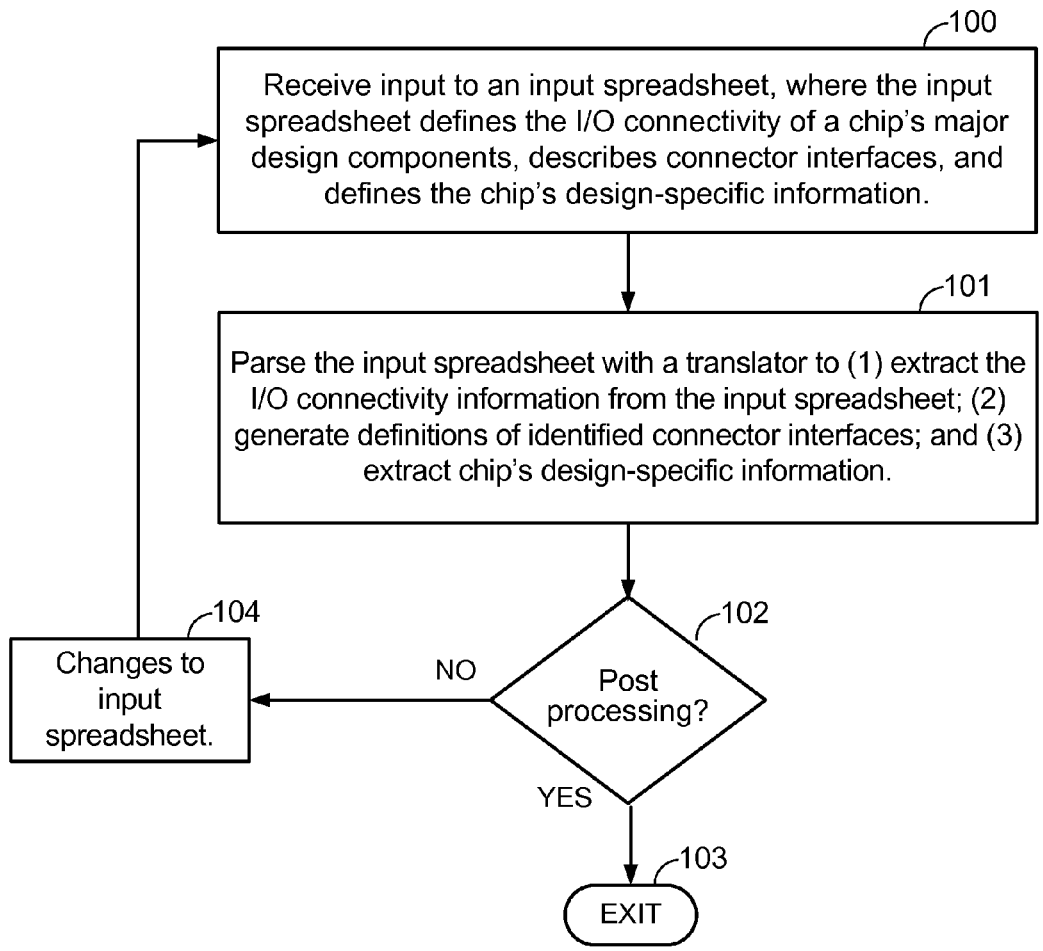
FIG. 1 is a functional block diagram illustrating example blocks executed to implement an interconnectivity information extraction process configured according to one embodiment of the present teachings.

FIG. 1 is a functional block diagram illustrating example blocks executed to implement an interconnectivity information capture process configured according to one embodiment of the present teachings. In block 100, input is received to an input spreadsheet. The input spreadsheet is a text-based document that (1) defines the I/O connectivity of the major design components in a chip design, (2) describes various connector interfaces, and (3) defines various design-specific information for the chip, such as rail voltage, I/O signal polarity, signal width, and the like. Depending on the particular embodiment implemented, the input to this input spreadsheet may be from a user, such as a chip designer or test engineer, or may be automatically entered using IC design analysis software.

The input spreadsheet is then parsed, in block 101, with a translator to extract the I/O connectivity information, to generate definitions of any identified connector interfaces that were not specifically defined in the input spreadsheet, and to extract any of the design-specific information. A determination is made, in block 102, whether the extracted information is ready for post processing. If so, then the extraction process ends, in block 103, and exits for post processing. If the extracted information is not ready for post processing, changes to the input spreadsheet are made, in block 104, and the process begins again at block 100.

While parsing the input spreadsheet, the translator will also provide considerable error detection. To begin with, the nature of the parsing performed, searches for particular I/O connectivity information. Thus, spelling errors will often be identified when certain signal names, device names, destinations, or the like, are identified in the spreadsheet entries for a first device, but then do not match exactly in the other device entries. Moreover, while matching the connectivity information that is extracted and incorporating the generated I/O connector information and the additional design-specific information, the translator will also identify when signal names do not match up with expected signal definitions, or identify when expected devices or connectors do not match up with the correct devices or connectors, or identify when an expected destination device identified in one device entry does not match up with the expected signals identified in the entry for that destination device. Various known methods for flagging such errors and facilitating correction of the errors may be employed. In addition, the translator may be coded to produce no output until all such errors have been corrected.

It should be noted that the various functional blocks executed to implement the alternative embodiments of the present teachings may be integrated into a least one semiconductor die. The circuitry, logic, or firmware integrated in such a semiconductor die will allow the functionality of the various embodiments of the present teachings to be available in a chip set of one or more semiconductor chips.

Figure 2A:
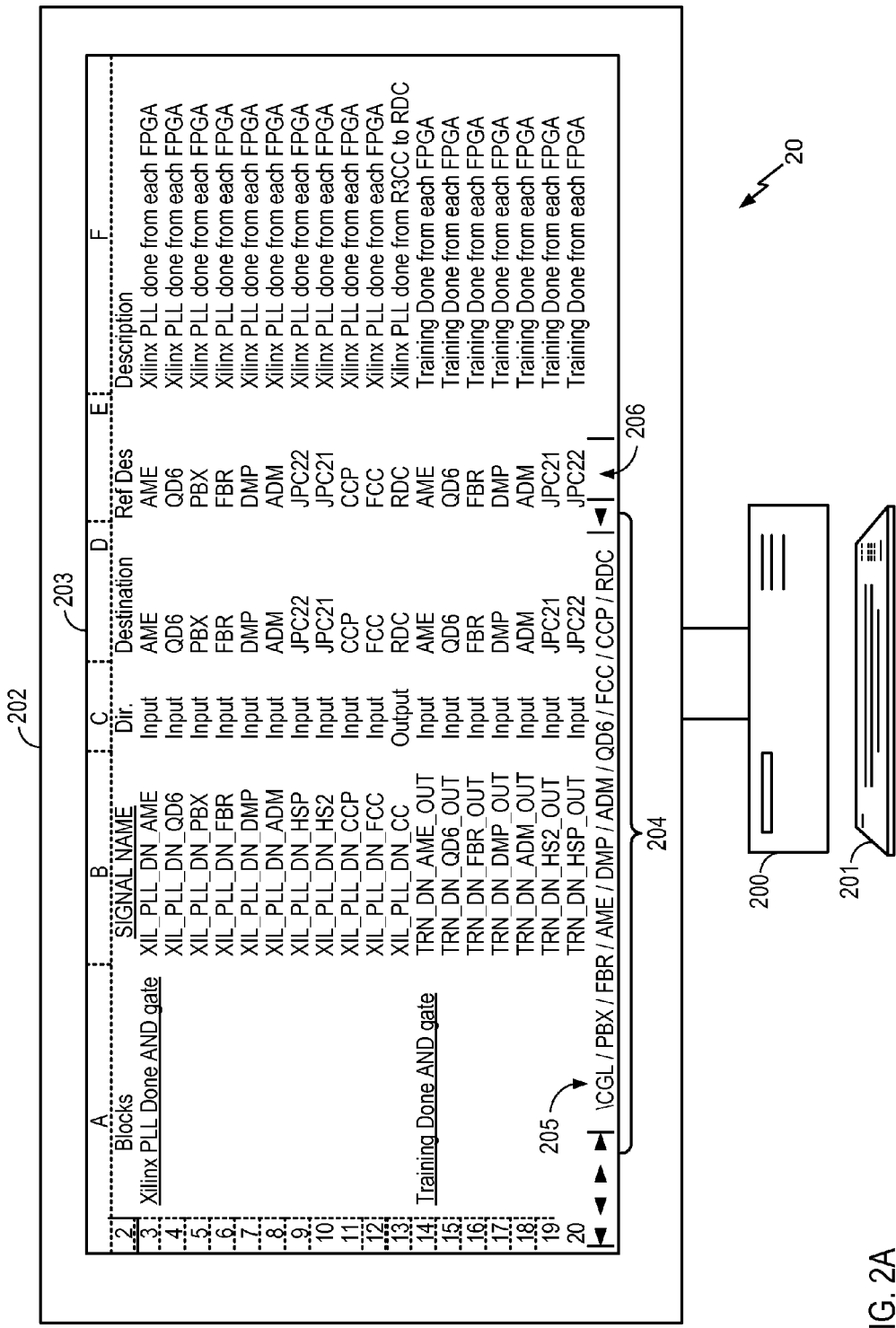
FIG. 2A is a block diagram illustrating a interconnectivity information capture system configured according to one embodiment of the present teachings

FIG. 2A is a block diagram illustrating an interconnectivity information capture system 20 configured according to one embodiment of the present teachings. A computing device 200 executes a text editing application which is displayed to a user on a display device 202 and for which input is received from a user through an input device 201. An I/O definition file 203 (e.g., an input spreadsheet, a comma separated value file or table) is displayed on the display device 202 allowing a user to input various design information for use in developing the emulator circuit board design. The I/O definition file 203 includes text descriptions of device blocks, signal names, signal direction (e.g., input, output, bi-directional), destination devices, connection descriptions, and the like. This design-related information is organized using known configuration orientations for spreadsheets and tables, such as by grouping common elements in row and column format. For example, in column A of the I/O definition file 203, the name of each block in the partitioned device is provided. A collection of rows for each named block provides additional connectivity information related to that particular block. Column B of the I/O definition file 203 provides the signal names handled in each block. The signal names identified in rows 3-13 identify the signals handled in the block named "Xilinx PLL Done AND gate." The other information across the visible screen of the I/O definition file 203 in rows 3-13 also relates to the Xilinx PLL Done AND gate block, such as the signal direction of column C, the target device of column D, the reference descriptor of column E, and the description of the signal of column F. This structure is continued for each block of each device.

In an example of the information contained in the I/O definition file 203, the signal name at column B, row 14, is TRN_DN_AME_OUT. This signal is handled by the block "Training Done AND gate." Column C, row 14 textually defines this signal to be an input signal to the Training Done AND gate block. The origin (i.e., target device) of the signal is the AME device, as indicated in column D, row 14, which has a reference descriptor of "AME" also, as provided in column E, row 14. Finally, the description of this particular signal for the Training Done AND gate block is explained as, "Training Done from each FPGA," in column F, row 14. Thus, the information contained in row 14 describes various connectivity aspects of the TRN_DN_AME_OUT signal as it is handled by the Training Done AND gate block of the CGL device.

Figure 2B:
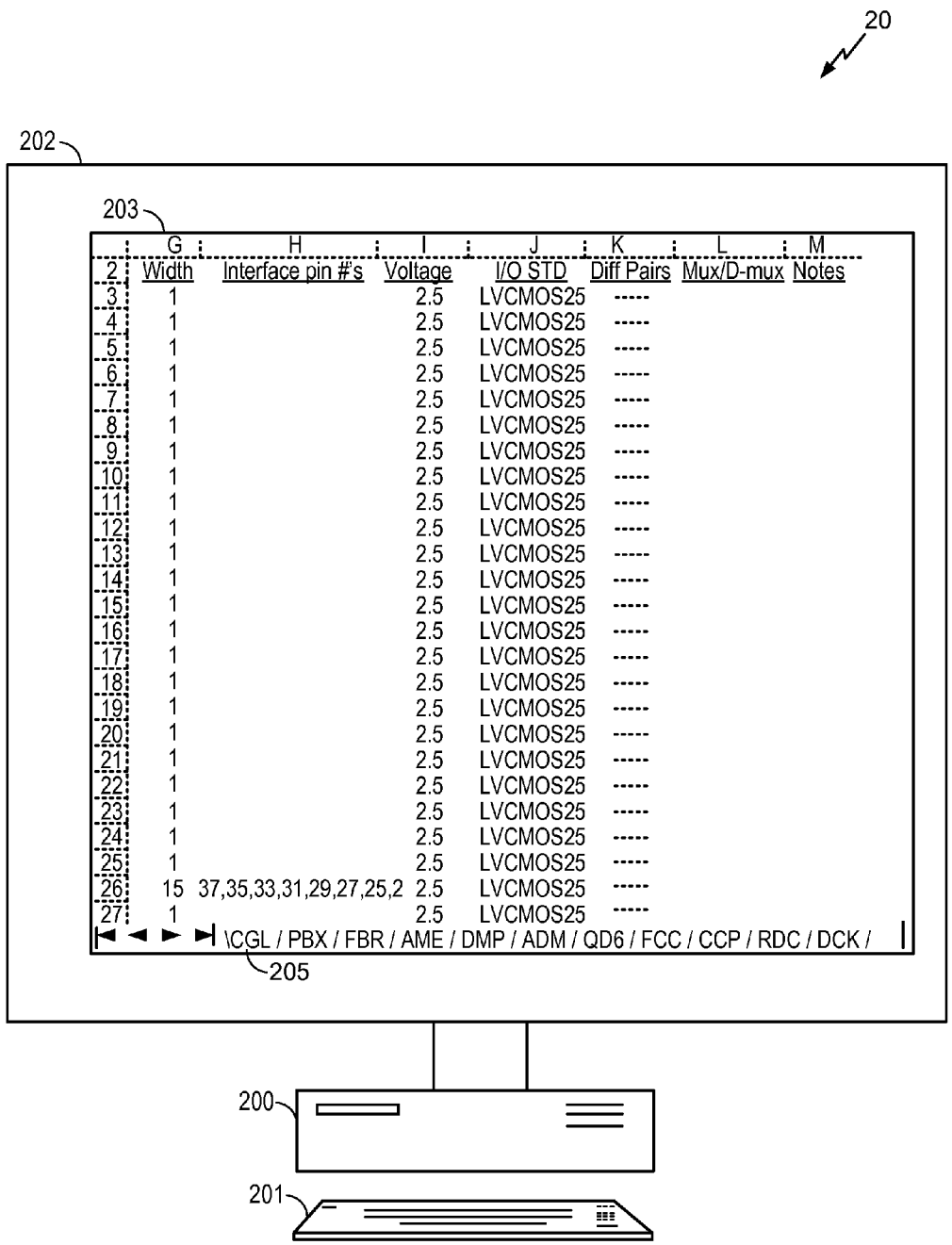
FIG. 2B is a block diagram illustrating a interconnectivity information capture system configured according to one embodiment of the present teachings

The I/O definition file 203 includes various numbers of columns and various numbers of rows. However, because of the physical dimension limitations of the display device 202, only a portion of the I/O definition file 203 is visible to the user at any given time. In the horizontal direction, a user will manipulate slider 206 to change the current horizontal view of the I/O definition file 203 within the display area of display device 202. In so doing, the user can access additional information provided for the blocks of the CGL device. FIG. 2B is a block diagram illustrating the interconnectivity information capture system 20 configured according to one embodiment of the present teachings. As the user manipulates slider 206 (FIG. 2A), additional columns of information in the I/O definition file 203 are positioned into the visible display area of the display device 202. In the illustrated example, columns G-M are revealed.

Continuing with the example connectivity information for the TRN_DN_AME_OUT signal from the Training Done AND gate block (FIG. 2A), column G, row 14 defines the width or number of connections that accompany the signal. In the case of the TRN_DN_AME_OUT signal, there is a width of one indicating only a single connection. Other signals identify a greater width or number of connections. For example, row 26, which involves the signal DBG_CGL from the Training Done AND gate block (FIG. 2A), identifies a width of 15. In column H, the different device interface pins for the emulator circuit board are also identified for the DBG_CGL signal. These interface pins identify the particular pins on a device/connector that connect the destination device/connector, as defined in column D (FIG. 2A), to the device of the active page (e.g., CGL).

The entry of column I, row 14 defines the voltage rail associated with the TRN_DN_AME_OUT signal. In the illustrated example, the TRN_DN_AME_OUT signal uses a voltage rail of 2.5 volts. Different devices can support multiple voltage domains. Thus, depending on the device and the voltage standard, the column I entries will define which voltage goes along with the particular signal. Additional voltage-related information is provided in column J, row 14 for the TRN_DN_AME_OUT signal. This information defines the type of voltage I/O standard used for that particular signal. The voltage I/O standard provides an indication of the particular voltage or voltages that are available in devices that operate in the particular standard. The LVCMOS25 (low-voltage complementary metal-oxide-semiconductor 25) standard defines a voltage standard of 2.5 volts, which is the identified 2.5 volt voltage rail from column I. The remaining information illustrated in the FIG. 2B embodiment includes whether the signal is a differential pair I/O signal (column K), which affects the polarity of the signal, and whether or not the signal is multiplexed or is to be de-multiplexed (column L). The remaining information for column M provides an opportunity for the designer to enter notes of some kind.

The I/O definition file 203 captures the entire connectivity of the chip design to be emulated in a textual format. When the translator parses through the I/O definition file 203, it extracts relevant I/O. However, the translator also locates any connector interface entries that are not necessarily further defined in its own page tab of tabs 204. For these connector interfaces, the translator uses a device library to generate or retrieve the connection interface definition for that connector. For example, in column D, row 20, the destination of the input signal, TRN_DN_HSP_OUT is identified as JPC22. However, JPC22 does not correspond to one of the tabs 204. Therefore, there will not be sufficient definition of this target connector interface. Using the device library, the translator retrieves the associated definition for the JPC22 interface. For example, a platform can have a display, a high-speed universal serial bus (USB), and memory connectors described with their respective connections in the I/O definition file 203. When the translator is executed, all of those connector descriptions are identified and their definitions are extracted from the library, resulting in information that can be loaded concurrently into the post processing tool at one time.

The I/O definition file 203 includes a similar page with similar connectivity information for each of the partitioned devices in the emulator circuit board design. The tabs 204 provide access to these additional device pages. In the example embodiment described in FIG. 2A, each of the tabs 204 is labeled with the name or abbreviation of the particular device. For example, the tab 205, labeled "CGL," is the device for which the visible portion of the I/O definition file 203 is associated.

It should be noted that additional embodiments of the present teachings may use different configurations of the I/O definition file 203. For example, the block name may not be found in column A (FIG. 2A), but in a different column. Similarly, the specific list of interfaces (FIG. 2B) may exists at other locations besides column H. The I/O definition file 203 could also include additional types of information deemed useful to a post processing tool. The various embodiments of the present teachings are not limited to the specific configurations presented in FIGS. 2A and 2B.

Figure 3A:
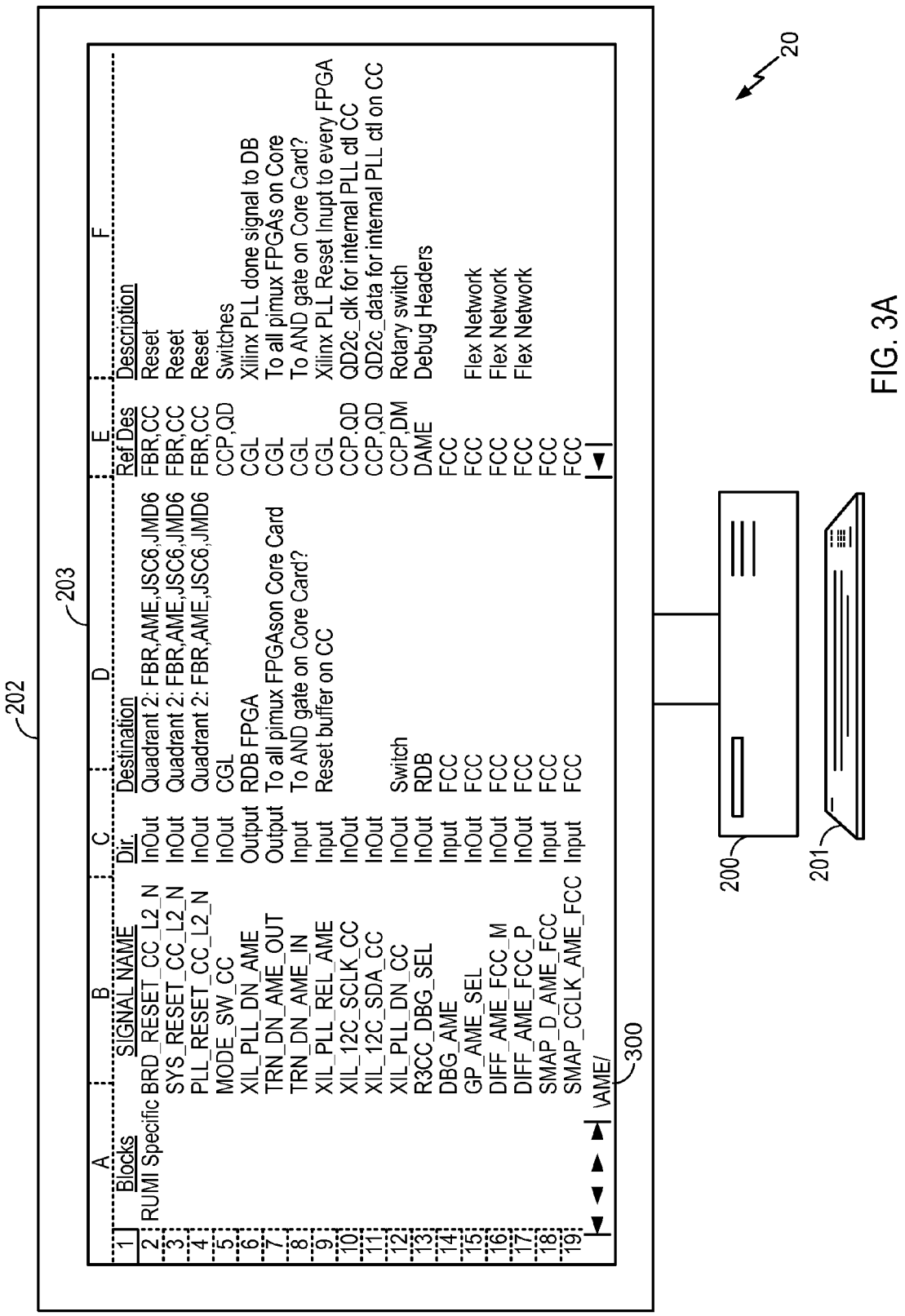
FIGS. 3A is a block diagram illustrating additional views of the interconnectivity information capture system configured according to one embodiment of the present teachings.
Figure 3B:
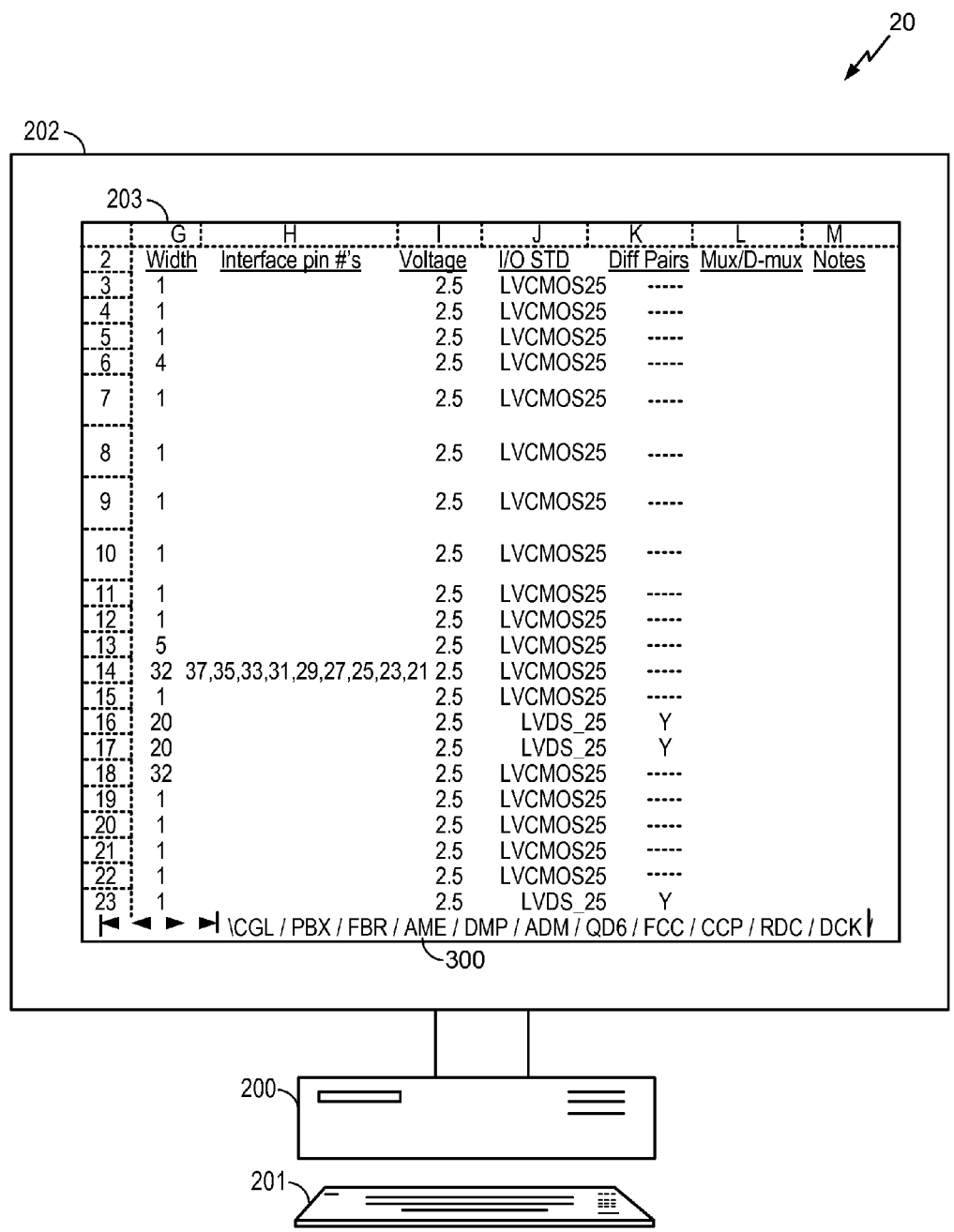
FIG. 3B is a block diagram illustrating additional views of the interconnectivity information capture system configured according to one embodiment of the present teachings.

Turning now to FIGS. 3A and 3B, block diagrams are illustrated showing additional views of the interconnectivity information capture system 20 configured according to one embodiment of the present teachings. The interconnectivity information capture system 20 is illustrated in FIGS. 3A. and 3B with the same computing device 200, input device 201, and display device 202. A user of the application presenting the I/O definition file 203 has selected the AME tab 300. In response to selecting the AME tab 300, the current view on display device 202 of the I/O definition file 203 changes to the connectivity entries related to the partitioned AME device. The page configuration of the various information entries is the same as was presented in FIGS. 2A and 2B. FIG. 3B represents the additional page entries that do not fit within the viewing area of the display device 202.

Examination of the information entries related to the AME tab 300 assist in determining errors in the information entry as well as setting out the various connections between the partitioned devices. For example, with reference to FIG. 2A, the block Xilinx PLL Done AND gate references in column B, row 3, the signal XIL_PLL_DN_AME, which is characterized as an input signal, column C, with the target device, i.e., the source of the input signal, listed in column D as AME. Therefore, when examining the page coupled to the AME tab 300, the script will expect a corresponding entry. In fact, at column B, row 6, the RUMI Specific block, column A, row 2, identifies the signal XIL_PLL_DN_AME, here characterized as an output signal, column C, with a target of an RDB FPGA device, column D, and the reference description of the CGL device, column E. Therefore, by verifying the existence of the signal between the AME and CGL devices, the script then verifies the entries.

Figure 4:
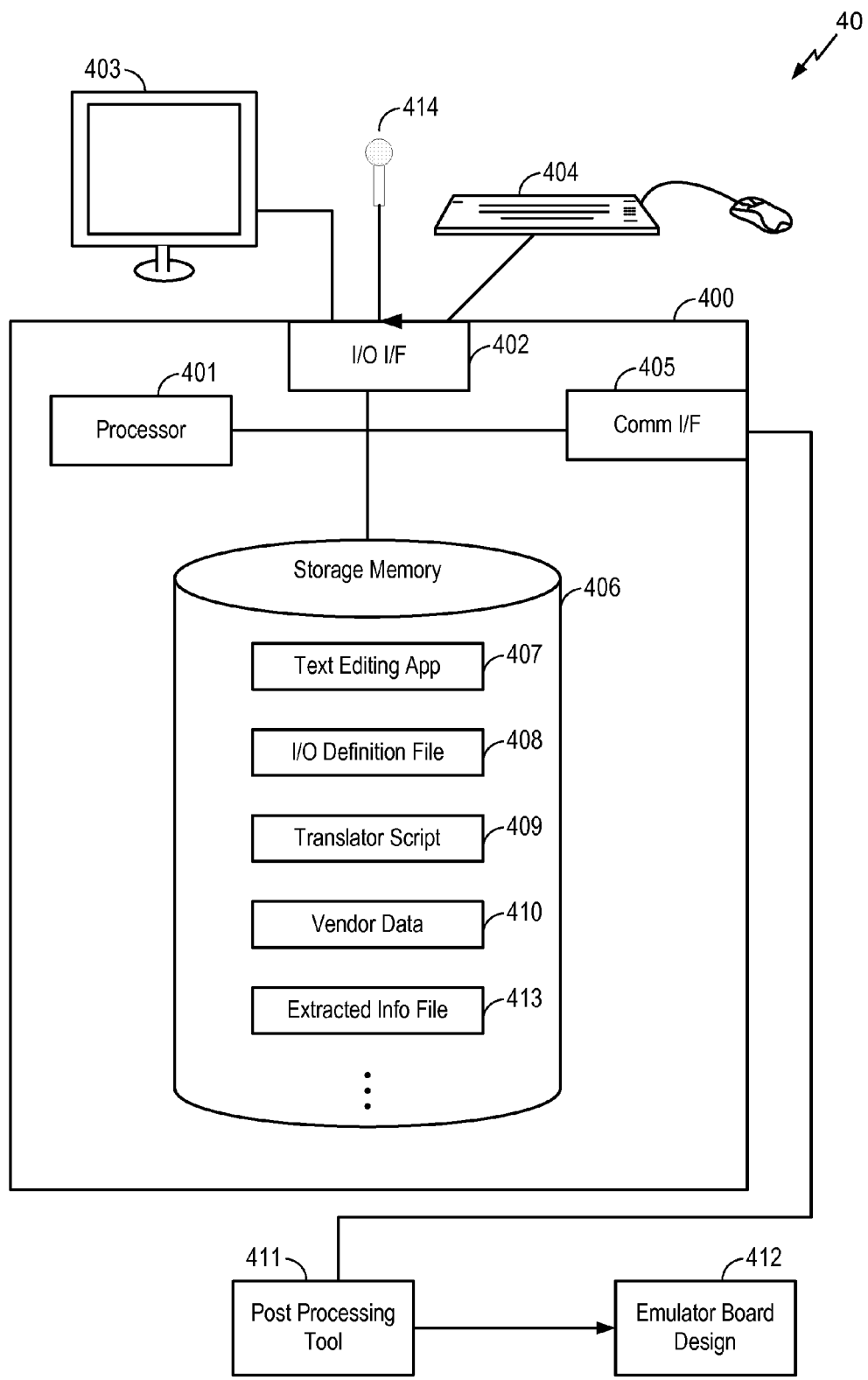
FIG. 4 is a block diagram illustrating an emulator circuit board design system configured according to one embodiment of the present teachings.

FIG. 4 is a block diagram illustrating an emulator circuit board design system 40 configured according to one embodiment of the present teachings. The emulator circuit board design system 40 includes a computer 400 and a post processing tool 411. The computer 400 includes a processor 401, an input/output (I/O) interface 402, which provides an interface between the computer 400 and a display/input device 403 and input devices 404 and 414, a communications interface 405, which provides an interface with devices and components external to the computer 400, such as the post processing tool 411. The computer 400 also includes a storage memory 406. Stored on the storage memory 406 is a text editing application 407, such as a spreadsheet application. When executed by the processor 401, the text editing application 407 configures the computer 400 to display a tabular file on the display device 403 and allow a user to enter information into the tabular file through the input device 404. The user runs the text editing application 407 to input data related to the partitioned devices of a particular chip design. This information is saved by the text editing application 407 on to storage memory 406 as an I/O definition file 408. The tabular configuration would be similar to that illustrated in FIGS. 2A, 2B, 3A, and 3B.

The storage memory 406 also includes a translator 409. When executed by the processor 401, the translator 409 parses through the I/O definition file 408 extracting the connectivity information for each of the partitioned devices. This connectivity information is stored in an extracted information file 413 on the storage memory 406. In addition to the connectivity information for the partitioned devices, the translator 409 identifies connector interfaces referenced in the tabular file. The translator 409 accesses vendor data 410 stored on the storage memory 406 to obtain the standard definitions for these referenced connector interfaces. The translator 409 further identifies any design-specific information, such as rail voltages, signal width, signal polarity and the like, and extracts all of this relevant information into the extracted information file 413.

When the translator 409 successfully finishes extracting all of the relevant information from the I/O definition file 408, the post processing tool 411, based on this extracted information in the extracted information file 413, creates the connections between devices/connectors/etc within an emulator circuit board to reflect the chip design as defined in the I/O definition file 408. Moreover, each of the connections that are to be made between the individual partitioned devices are defined by the post processing tool 411 based on the extracted information file. The resulting emulator circuit board design 412, then, represents the chip design to be used for testing and verifying the design prior to manufacturing the finished chip.

It should be noted that while the different embodiments of the present teachings described herein have referred to the I/O definition file 408 as a spreadsheet file or tabular file, embodiments that use other text editing applications capable of generating other types of delimited text-based files are well within the scope of the present teachings. A delimited text-based file is any type of text-based file that establishes delimiters between a series of data, such as spreadsheet files, comma-separated value (CSV) text files, tabular text files, and the like. It should be noted that a text-based file can be either a text file or binary file that represents delimited text, such as some spreadsheet files.

Figure 5:
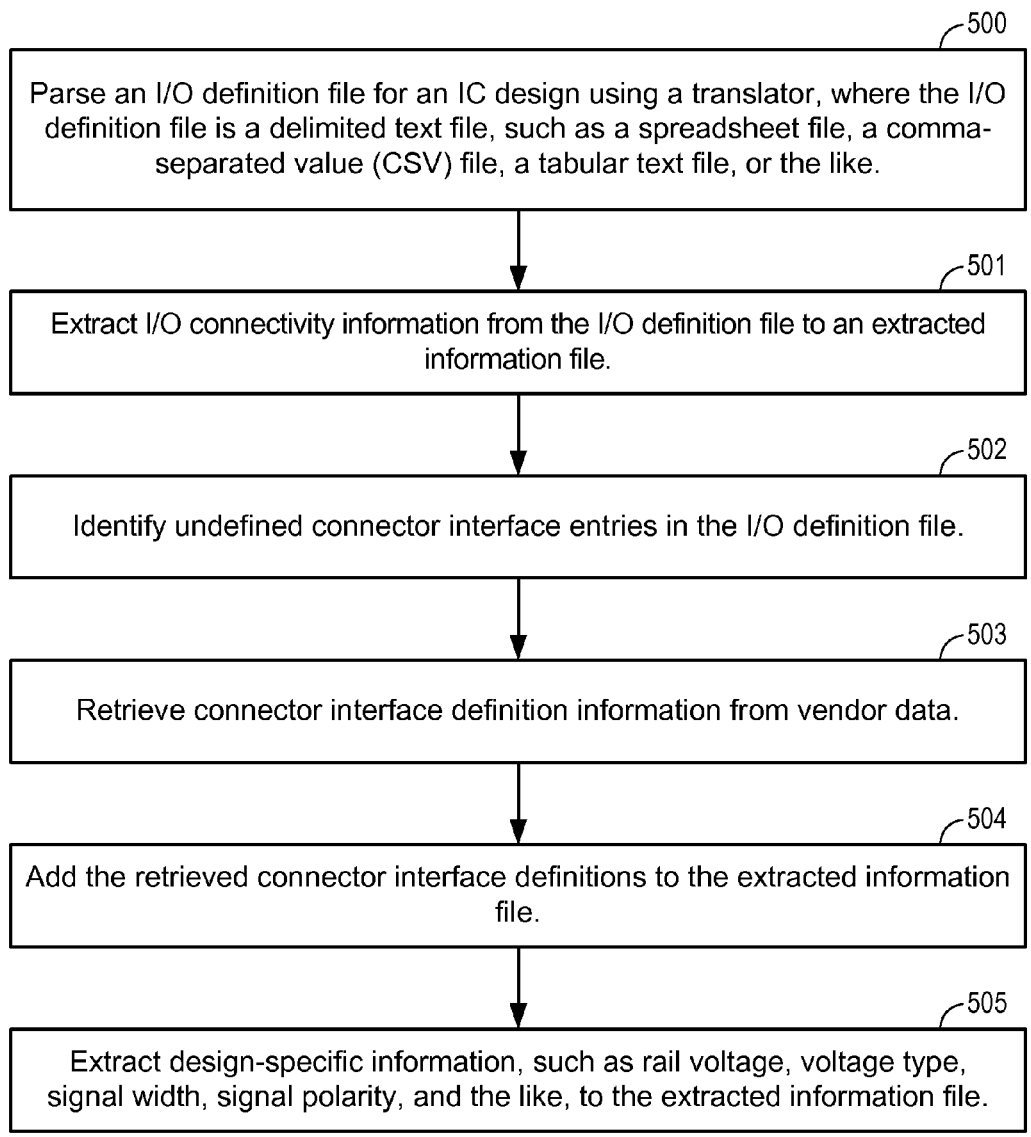
FIG. 5 is a functional block diagram illustrating example functional blocks executed in one embodiment of the present teachings.

FIG. 5 is a functional block diagram illustrating example functional blocks executed in one embodiment of the present teachings. In block 500, an I/O definition file for an IC design is parsed using a translator. The I/O definition file is a delimited text-based file, such as a spreadsheet file, a CSV file, a tabular text file, or the like. I/O connectivity information is extracted, in block 501, from the I/O definition file into an extracted data file. Undefined connector interface entries are identified, in block 502, in the I/O definition file. Connector interface definition information is then retrieved, in block 503, from vendor data. The retrieved connector interface definitions are added to the other extracted information, in block 504, into the extracted information file. In block 505, design-specific information, such as rail voltage, voltage type, signal width, signal polarity, and the like, is extracted into the extracted information file.

The methodologies described herein may be implemented by various components depending upon the application. For example, these methodologies may be implemented in hardware, firmware, software, or any combination thereof. For a hardware implementation, the processing units may be implemented within one or more ASICs, digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Figure 6:
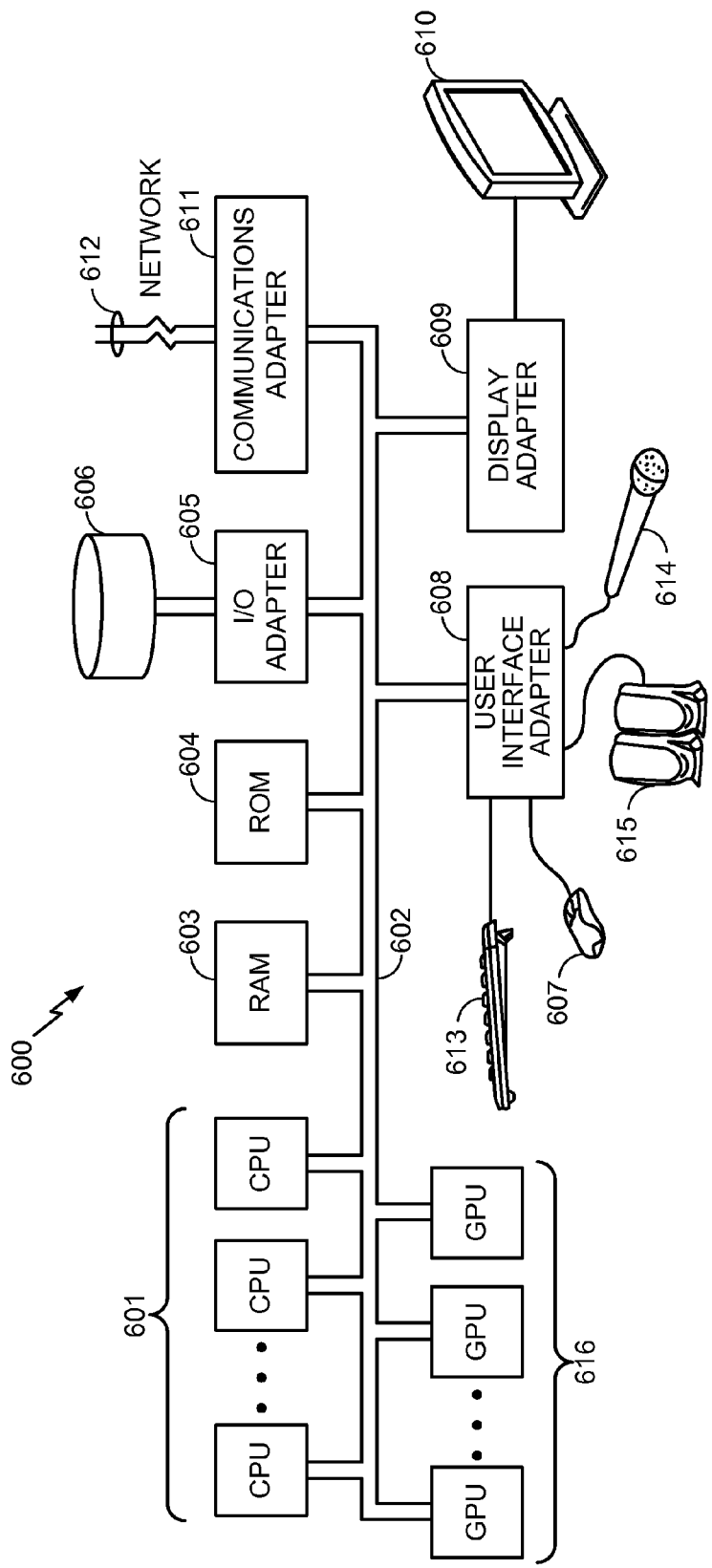
FIG. 6 illustrates an exemplary computer system which may be employed to implement certain embodiments of the present teachings.

FIG. 6 illustrates an exemplary computer system 600 which may be employed to implement certain embodiments of the present teachings. A central processing unit ("CPU" or "processor") 601 is coupled to a system bus 602. The CPU 601 may be any general-purpose processor. The present disclosure is not restricted by the architecture of the CPU 601 (or other components of the exemplary computer system 600) as long as the CPU 601 (and other components of the computer system 600) supports the inventive operations as described herein. As such, the CPU 601 may provide processing to the computer system 600 through one or more processors or processor cores. The CPU 601 may execute the various logical instructions described herein. For example, the CPU 601 may execute machine-level instructions according to the exemplary operational flow described above in conjunction with FIGS. 1 and 5. When executing instructions representative of the operational steps and signal processing illustrated in FIGS. 1 and 5, the CPU 601 becomes a special-purpose processor of a special purpose computing platform configured specifically to operate according to the various embodiments of the teachings described herein.

The computer system 600 also includes a random access memory (RAM) 603, which may be SRAM, DRAM, SDRAM, or the like. The computer system 600 includes a read-only memory (ROM) 604 which may be PROM, EPROM, EEPROM, or the like. The RAM 603 and ROM 604 hold user and system data and programs, as is well known in the art.

The I/O adapter 605 connects to a storage device(s) 606, such as one or more of hard drive, optical disk drive floppy disk drive, tape drive, etc., to the computer system 600. The storage devices are utilized in addition to the RAM 603 for the memory requirements associated with saving the look up tables corresponding channel quality measurements to QCM indices and the like. The communications adapter 611 is adapted to couple the computer system 600 to a network 612, which may enable information to be input to and/or output from the computer system 600 via the network 612 (e.g., the Internet or other wide-area network, a local-area network, a public or private switched telephony network, a wireless network, any combination of the foregoing). A user interface adapter 608 couples user input devices, such as a keyboard 613, a pointing device 607, and a microphone 614 and/or output devices, such as speaker(s) 615 to the computer system 600. A display adapter 609 is driven by the CPU 601 or by a graphical processing unit (GPU) 616 to control the display on the display device 610. The GPU 616 may be any various number of processors dedicated to graphics processing and, as illustrated, may be made up of one or more individual graphical processors. The GPU 616 processes the graphical instructions and transmits those instructions to the display adapter 609. The display adapter 609 further transmits those instructions for transforming or manipulating the state of the various numbers of pixels used by the display device 610 to visually present the desired information to a user. Such instructions include instructions for changing state from on to off, setting a particular color, intensity, duration, or the like. Each such instruction makes up the rendering instructions that control how and what is displayed on the display device 610.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art can readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for capturing interconnectivity data for multi-pin devices in the design of emulator circuit boards, said method comprising:

parsing, using a computer, an input/output definition file representing an integrated circuit design, said input/output definition file textually defining at least one device created by partitioning said integrated circuit design for application on at least one multi-pin device on an emulator circuit board;

extracting, using the computer, input/output connectivity information for said at least one device from said input/output definition file, wherein the input/output connectivity information extracted from said input/output definition file includes references to one or more connector interfaces that are undefined in said input/output definition file, wherein the references to the one or more undefined connector interfaces comprise at least one of one or more signal names, one or more device names, or one or more signal destinations that do not have any corresponding definitions in said input/output definition file;

generating, using the computer, connector interface definitions for the one or more undefined connector interfaces referenced in the input/output connectivity information extracted from said input/output definition file;

extracting, using the computer, design-specific information related to said integrated circuit design from said input/output definition file;

creating connections between one or more devices and one or more connectors within the emulator circuit board in response to extracting all relevant information from said input/output definition file and generating the connector interface definitions for the one or more undefined connector interfaces, wherein the connections created within the emulator circuit board reflect the integrated circuit design represented in said input/output definition file; and using the connections created within the emulator circuit board to test and verify the integrated circuit design represented in said input/output definition file prior to manufacturing a finished chip having the integrated circuit design.

2. The method of claim 1 wherein generating said connector interface definitions comprises:

identifying the one or more undefined connector interfaces referenced in the input/output connectivity information extracted from said input/output definition file;

retrieving said connector interface definitions from vendor data; and adding the retrieved connector interface definitions to the input/output definition file.

3. The method of claim 1 further comprising:

receiving, at the computer, said input/output definition file from one or more of an input device through which said input/output connectivity information, said references to the one or more undefined connector interfaces, and said design-specific information was entered into said input/output definition file; or an automated design analysis application operating on a computing device through which said input/output connectivity information, said references to the one or more undefined connector interfaces, and said design-specific information was entered into said input/output definition file.

4. The method of claim 1 wherein said at least one multi-pin device comprises one or more of:

a field programmable gate array (FPGA); or a complex programmable logic device (CPLD).

5. An emulator circuit board design system comprising:

a processor;

an input/output interface coupled to said processor;

a display device coupled to said input/output interface;

an input device coupled to said input/output interface;

a communication interface coupled to said processor;

a storage memory coupled to said processor; and a translator stored on said storage memory, wherein, when executed by said processor, said translator configures said system:

to parse an input/output definition file representing an integrated circuit design, wherein said input/output definition file defines at least one device created by partitioning said integrated circuit design for application on at least one multi-pin device on an emulator circuit board;

to extract input/output connectivity information for said at least one device from said input/output definition file, wherein the input/output connectivity information extracted from said input/output definition file includes references to one or more connector interfaces that are undefined in said input/output definition file, wherein the references to the one or more undefined connector interfaces comprise at least one of one or more signal names, one or more device names, or one or more signal destinations that do not have any corresponding definitions in said input/output definition file;

to generate connector interface definitions for the one or more undefined connector interfaces referenced in the input/output connectivity information extracted from said input/output definition file;

to extract design-specific information related to said integrated circuit design from said input/output definition file;

to create connections between one or more devices and one or more connectors within the emulator circuit board in response to extracting all relevant information from said input/output definition file and generating the connector interface definitions for the one or more undefined connector interfaces, wherein the connections created within the emulator circuit board reflect the integrated circuit design represented in said input/output definition file; and to use the connections created within the emulator circuit board to test and verify the integrated circuit design represented in said input/output definition file prior to manufacturing a finished chip having the integrated circuit design.

6. The system of claim 5 wherein said translator configuring said system to generate said connector interface definitions further configures said system:

to identify the one or more undefined connector interfaces referenced in the input/output connectivity information extracted from said input/output definition file;

to retrieve said connector interface definitions from vendor data; and to add the retrieved connector interface definitions to the input/output definition file, 7. The system of claim 5 wherein said translator, when executed by said processor, further configures said system:

to transmit said extracted input/output connectivity information, said generated connector interface definitions, and said extracted design-specific information to a post processing tool for creation of said emulator circuit board.

8. The system of claim 6 wherein said input/output interface is configured to receive said input/output definition file from one or more of:
  said input device through which said input/output connectivity information, said references to the one or more undefined connector interfaces, and said design-specific information was entered into said input/output definition file; or
  an automated design analysis application operating on a computing device through which said input/output connectivity information, said references to the one or more undefined connector interfaces, and said design-specific information was entered into said input/output definition file.

9. The system of claim 5 wherein said processor, said input/output interface, said communication interface, said storage memory, and said translator script are integrated into at least one semiconductor die.

10. The system of claim 5 wherein said at least one multi-pin device comprises one or more of:
  a field programmable gate array (FPGA); or
  a complex programmable logic device (CPLD).

11. A non-transitory computer-readable medium including program code tangibly stored thereon, wherein executing the stored program code on a computer causes the computer to:
  parse an input/output definition file representing an integrated circuit design, said input/output definition file textually defining at least one device created by partitioning said integrated circuit design for application on at least one multi-pin device on an emulator circuit board;
  extract input/output connectivity information for said at least one device from said input/output definition file, wherein the input/output connectivity information extracted from said input/output definition file includes references to one or more connector interfaces that are undefined in said input/output definition file, wherein the references to the one or more undefined connector interfaces comprise at least one of one or more signal names, one or more device names, or one or more signal destinations that do not have any corresponding definitions in said input/output definition file;
  generate connector interface definitions for the one or more undefined connector interfaces referenced in the input/output connectivity information extracted from said input/output definition file;
  extract design-specific information related to said integrated circuit design from said input/output definition file;
  create connections between one or more devices and one or more connectors within the emulator circuit board in response to extracting all relevant information from said input/output definition file and generating the connector interface definitions for the one or more undefined connector interfaces, wherein the connections created within the emulator circuit board reflect the integrated circuit design represented in said input/output definition file; and
  use the connections created within the emulator circuit board to test and verify the integrated circuit design represented in said input/output definition file prior to manufacturing a finished chip having the integrated circuit design.

12. The non-transitory computer-readable medium of claim 11, wherein executing the stored program code that causes the computer to generate said connector interface definitions further causes the computer to:
  identify the one or more undefined connector interfaces referenced in the input/output connectivity information extracted from said input/output definition file;
  retrieve said connector interface definitions from vendor data; and
  add the retrieved connector interface definitions to the input/output definition file.

13. The non-transitory computer-readable medium of claim 11, wherein executing the stored program code on the computer further causes the computer to:
  transmit said extracted input/output connectivity information, said generated connector interface definitions, and said extracted design-specific information to a post processing tool for creation of said emulator circuit board.

14. The non-transitory computer-readable medium of claim 11, wherein executing the stored program code on the computer further causes the computer to:
  receive said input/output definition file from one or more of:
    said input device through which said input/output connectivity information, said references to the one or more undefined connector interfaces, and said design-specific information was entered into said input/output definition file; or
    an automated design analysis application operating on a computing device through which said input/output connectivity information, said references to the one or more undefined connector interfaces, and said design-specific information was entered into said input/output definition file.

15. The non-transitory computer-readable medium of claim 11, wherein said non-transitory computer readable medium comprises at least one semiconductor die having the stored program code integrated therein.

16. A system for capturing of interconnectivity data for multi-pin devices in the design of emulator circuit boards, said system comprising:
  means for parsing an input/output definition file representing an integrated circuit design, said input/output definition file textually defining at least one device created by partitioning said integrated circuit design for application on at least one multi-pin device on an emulator circuit board;
  means for extracting input/output connectivity information for said at least one device from said input/output definition file, wherein the input/output connectivity information extracted from said input/output definition file includes references to one or more connector interfaces that are undefined in said input/output definition file, wherein the references to the one or more undefined connector interfaces comprise at least one of one or more signal names, one or more device names, or one or more signal destinations that do not have any corresponding definitions in said input/output definition file;
  means for generating connector interface definitions for the one or more undefined connector interfaces referenced in the input/output connectivity information extracted from said input/output definition file;
  means for extracting design-specific information related to said integrated circuit design from said input/output definition file;
  means for creating connections between one or more devices and one or more connectors within the emulator circuit board in response to extracting all relevant information from said input/output definition file and generating the connector interface definitions for the one or more undefined connector interfaces, wherein the connections created within the emulator circuit board reflect the integrated circuit design represented in said input/output definition file; and means for using the connections created within the emulator circuit board to test and verify the integrated circuit design represented in said input/output definition file prior to manufacturing a finished chip having the integrated circuit design.

17. The system of claim 16 wherein said means for generating said connector interface definitions comprise:

means for identifying the one or more undefined connector interfaces referenced in the input/output connectivity information extracted from said input/output definition file;

means for retrieving said connector interface definitions from vendor data; and means for adding the retrieved connector interface definitions to the input/output definition file.

18. The system of claim 16 wherein said at least one multi-pin device comprises one or more of:

a field programmable gate array (FPGA);

a complex programmable logic device (CPLD).

* * * * *